United States Patent
Ishida (10) Patent No.: US 12,261,048 B2
(45) Date of Patent: Mar. 25, 2025

(54) METHOD FOR MANUFACTURING SEMICONDUCTOR DEVICE

(71) Applicants: DENSO CORPORATION, Aichi-pref. (JP); TOYOTA JIDOSHA KABUSHIKI KAISHA, Toyota (JP); MIRISE Technologies Corporation, Nisshin (JP)

(72) Inventor: Takashi Ishida, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 350 days.

(21) Appl. No.: 17/972,626

(22) Filed: Oct. 25, 2022

(65) Prior Publication Data

US 2023/0154756 A1    May 18, 2023

(30) Foreign Application Priority Data

Nov. 18, 2021    (JP) .................................. 2021-187690

(51) Int. Cl.
*H01L 21/268*    (2006.01)
*H01L 21/78*    (2006.01)
*H01L 21/326*    (2006.01)

(52) U.S. Cl.
CPC ........ *H01L 21/268* (2013.01); *H01L 21/7813* (2013.01); *H01L 21/326* (2013.01)

(58) Field of Classification Search
CPC .. H01L 21/268; H01L 21/326; H01L 21/7813
See application file for complete search history.

(56) References Cited

U.S. PATENT DOCUMENTS 12,098,476 B2 *    9/2024    Kaneko ............ H01L 21/02579
2017/0372965 A1    12/2017    Nishibayashi et al.

* cited by examiner

*Primary Examiner* — David Vu
*Assistant Examiner* — Brandon C Fox
(74) *Attorney, Agent, or Firm* — Posz Law Group, PLC

(57) ABSTRACT

A method for manufacturing a semiconductor device includes: irradiating, with laser light, a semiconductor substrate having a p-type first semiconductor layer and an n-type second semiconductor layer so that the laser light converges on an interface between the first semiconductor layer and the second semiconductor layer, wherein each of the p-type first semiconductor layer and the n-type second semiconductor layer placed on the first semiconductor layer is formed of a compound semiconductor; and separating the semiconductor substrate into the first semiconductor layer and the second semiconductor layer along the interface.

3 Claims, 6 Drawing Sheets

METHOD FOR MANUFACTURING SEMICONDUCTOR DEVICE

CROSS REFERENCE TO RELATED APPLICATION

The present application claims the benefit of priority from Japanese Patent Application No. 2021-187690 filed on Nov. 18, 2021. The entire disclosure of the above application is incorporated herein by reference.

TECHNICAL FIELD

The present disclosure relates to a method for manufacturing a semiconductor device.

As a comparative example, there is a method for manufacturing a semiconductor device. In this manufacturing method, first, ions are implanted to a certain depth from a surface of a seed substrate, and an ion-implantation layer is formed. In the ion-implantation layer, an energy of the implanted ions weakens bonds between elements as compared to other semiconductor regions. Then, laser light is applied to the surface of the seed substrate to give energy to the implanted ions. Thereby, the bonds between elements are broken, and the semiconductor substrate is separated from the seed substrate along the ion-implantation layer.

SUMMARY

A method for manufacturing a semiconductor device includes: irradiating, with laser light, a semiconductor substrate having a p-type first semiconductor layer and an n-type second semiconductor layer so that the laser light converges on an interface between the first semiconductor layer and the second semiconductor layer, wherein each of the p-type first semiconductor layer and the n-type second semiconductor layer placed on the first semiconductor layer is formed of a compound semiconductor; and separating the semiconductor substrate into the first semiconductor layer and the second semiconductor layer along the interface.

DETAILED DESCRIPTION

In the manufacturing method of the comparative example, a crystal structure of the ion-implantation layer is disturbed by the implanted ions. Therefore, when the seed substrate is separated along the ion-implantation layer, the crystal structure of the region exposed on the separation surface of the obtained semiconductor substrate is disturbed. Therefore, when this semiconductor substrate is used, for example, a difficulty arises in that the resistance of the semiconductor device increases. The present disclosure provides a technology capable of ensuring the quality of a separation surface when a semiconductor substrate is separated.

According to one example of the present disclosure, a method for manufacturing a semiconductor device includes: irradiating, with laser light, a semiconductor substrate having a p-type first semiconductor layer and an n-type second semiconductor layer so that the laser light converges on an interface between the first semiconductor layer and the second semiconductor layer, wherein each of the p-type first semiconductor layer and the n-type second semiconductor layer placed on the first semiconductor layer is formed of a compound semiconductor; and separating the semiconductor substrate into the first semiconductor layer and the second semiconductor layer along the interface.

In the above manufacturing method, the semiconductor substrate has the p-type first semiconductor layer and the n-type second semiconductor layer. Therefore, a depletion layer due to a built-in potential is formed in the vicinity of the interface between the first semiconductor layer and the second semiconductor layer. That is, the electric field is applied to the vicinity of the interface. Therefore, in the vicinity of the interface between the first semiconductor layer and the second semiconductor layer, Franz-Keldysh effect occurs, and long-wavelength (that is, low-energy) laser light is easily absorbed. That is, the light absorption efficiency is higher in a region in the vicinity of the interface between the first semiconductor layer and the second semiconductor layer than that in other semiconductor regions. Accordingly, by irradiating the interface with laser light so that the laser light converges on the interface, the laser light is efficiently absorbed in the vicinity of the interface, and the first semiconductor layer and the second semiconductor layer can be separated along the interface. Further, in this separation method, a crystal structure of the semiconductor on the separation plane is less likely to be disturbed as compared with a separation method of forming an ion-implantation layer. Hence, according to this manufacturing method, it may be possible to manufacture a high-quality semiconductor device.

The technical elements disclosed herein are listed below. The following technical elements are useful independently.

In one example of a manufacturing method in this specification, the compound semiconductor may be gallium nitride. When it is assumed that an effective acceptor concentration of the first semiconductor layer is Na ($cm^{-3}$), an effective donor concentration of the second semiconductor layer is Nd ($cm^{-3}$), an intrinsic carrier concentration of gallium nitride is $n_i$ ($cm^{-3}$), a dielectric constant of gallium nitride is $\varepsilon_{GaN}$ (F/cm$^2$), a temperature is T (K), and a Boltzmann constant is $k_B$ (J/K), the following expression may be satisfied.

$$1.2 \leq \sqrt{\frac{2k_B T N_a N_d}{\varepsilon_{GaN}(N_a + N_d)} \cdot \ln\left(\frac{N_a N_d}{n_i^2}\right)}$$

When the effective acceptor concentration of the first semiconductor layer and the effective donor concentration of the second semiconductor layer satisfy the above expression, an appropriate electric field is applied to the vicinity of the interface between the first semiconductor layer and the second semiconductor layer by the built-in potential, and it may be possible to efficiently absorb, in the vicinity of the interface, laser light having a wavelength longer than a wavelength corresponding to a bandgap of the gallium nitride.

According to a manufacturing method of one example of the present disclosure, in a process of applying the laser light, the laser light may be applied in a state where a voltage of the second semiconductor layer has a higher potential than that of the first semiconductor layer and is applied to the semiconductor substrate.

In such a configuration, the laser light is applied in a state where a reverse voltage is applied to the pn junction of the semiconductor substrate. By applying the reverse voltage to the pn junction, a depletion layer formed in the vicinity of the interface between the first semiconductor layer and the second semiconductor layer spreads. That is, the electric field applied to the vicinity of the interface is increased. Therefore, the Franz-Keldysh effect becomes greater, and longer-wavelength laser light can be absorbed in the vicinity of the interface.

First Embodiment

A manufacturing method of a semiconductor device according to a first embodiment will be described with reference to the drawings. This manufacturing method is characterized by a process of separating the semiconductor substrate into two layers. Accordingly, the manufacturing method of the present embodiment is not limited to semiconductor devices having a specific structure, and can be widely used for semiconductor devices having a semiconductor substrate including compound-semiconductors and semi-finished products thereof. Hereinafter, the process of separating the semiconductor substrate including a compound semiconductor into two layers will be mainly described, and the description of other manufacturing processes will be omitted. Note that, as for other manufacturing processes of the semiconductor device, necessary processes may be appropriately performed according to a structure of the semiconductor device.

Figure 1:
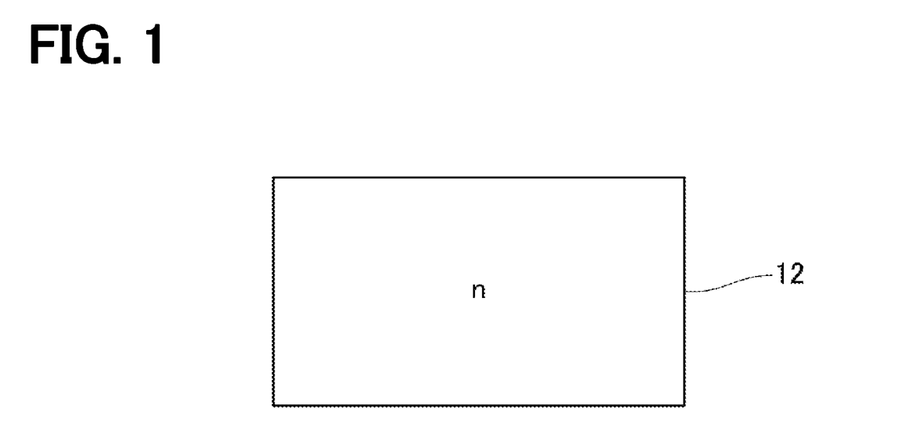
FIG. 1 shows a manufacturing process of a semiconductor device according to a first embodiment.

First, as shown in FIG. 1, an n-type semiconductor layer 12 is prepared. The semiconductor layer 12 is made of gallium nitride. Note that the material of the semiconductor layer 12 is not limited to gallium nitride. The semiconductor layer 12 may be composed of, for example, other compound semiconductors such as silicon carbide.

Figure 2:
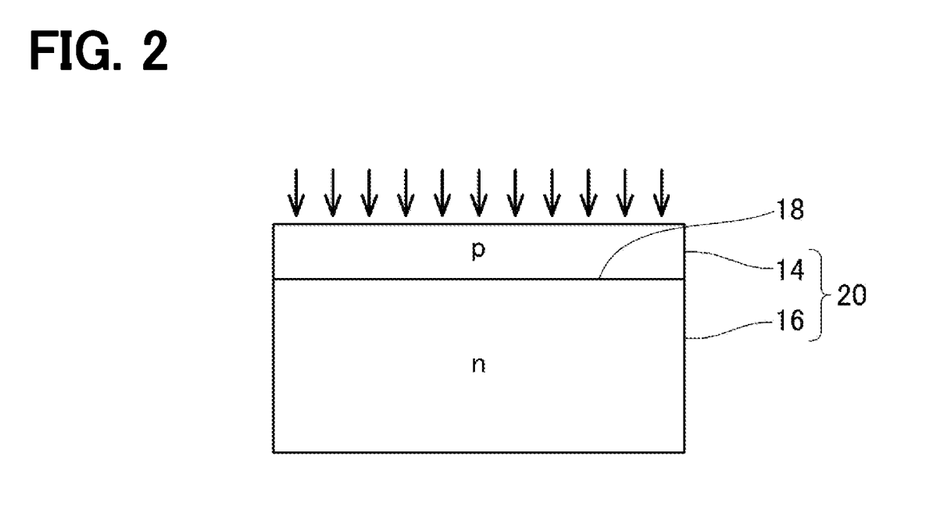
FIG. 2 shows a manufacturing process of the semiconductor device according to the first embodiment.

Next, as shown in FIG. 2, a p-type region 14 is formed in a surface layer portion of the semiconductor layer 12 by ion-implanting, for example, magnesium as a p-type impurity into the semiconductor layer 12. Then, an ultra-high-pressure annealing (UHPA) process is performed to activate the implanted magnesium ions, and the p-type first semiconductor layer 14 is formed. The remaining n-type region of the semiconductor layer 12 becomes a second semiconductor layer 16. Thereby, a semiconductor substrate 20 having the second semiconductor layer 16 and the first semiconductor layer 14 placed on the second semiconductor layer 16 is obtained.

In a case where the semiconductor substrate 20 shown in FIG. 2 is manufactured, the amount of implanted magnesium ions is adjusted so as to satisfy the following expression when it is assumed that the effective acceptor concentration of the first semiconductor layer 14 is Na (cm$^{-3}$), the effective donor concentration of the second semiconductor layer 16 is Nd (cm$^{-3}$), the intrinsic carrier concentration of gallium nitride is $n_i$ (cm$^{-3}$), the dielectric constant of gallium nitride is $\varepsilon_{GaN}$ (F/cm$^2$), the temperature is T (K), and the Boltzmann constant is $k_B$ (J/K).

$$1.2 \leq \sqrt{\frac{2k_B T N_a N_d}{\varepsilon_{GaN}(N_a + N_d)} \cdot \ln\left(\frac{N_a N_d}{n_i^2}\right)} \quad \text{[Expression]}$$

Figure 3:
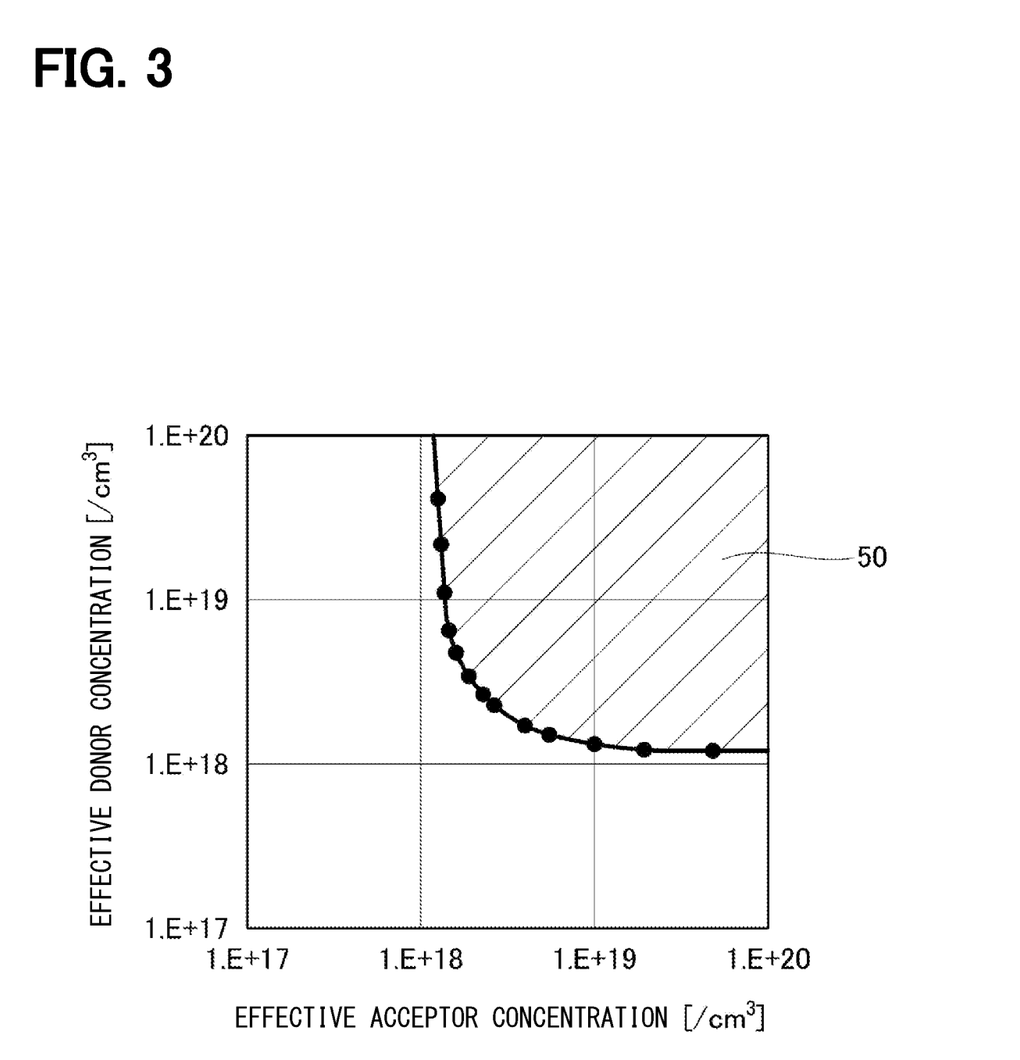
FIG. 3 is a graph showing a result of simulating a relationship between an effective acceptor concentration of a first semiconductor layer and an effective donor concentration of a second semiconductor layer for applying a specific electric field intensity to a semiconductor substrate.

The effective acceptor concentration of the first semiconductor layer 14 is calculated by subtracting the n-type impurity concentration from the p-type impurity concentration in the first semiconductor layer 14. The effective donor concentration of the second semiconductor layer 16 is calculated by subtracting the p-type impurity concentration from the n-type impurity concentration in the second semiconductor layer 16. FIG. 3 shows a graph of the above expression. Although details will be described later, in the semiconductor substrate 20 that satisfies the above expression, the electric field intensity applied to the vicinity of an interface 18 between the first semiconductor layer 14 and the second semiconductor layer 16 is 1.2 MV/cm or more.

Figure 4:
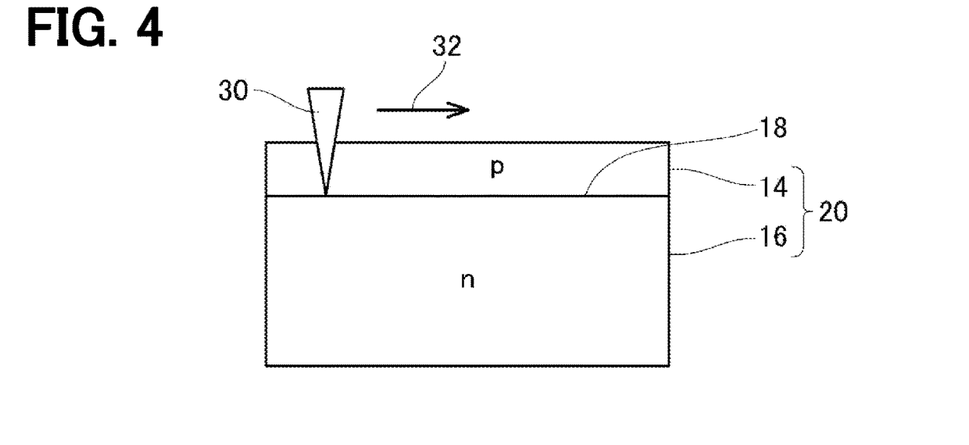
FIG. 4 shows a manufacturing process of the semiconductor device according to the first embodiment.
Figure 5:
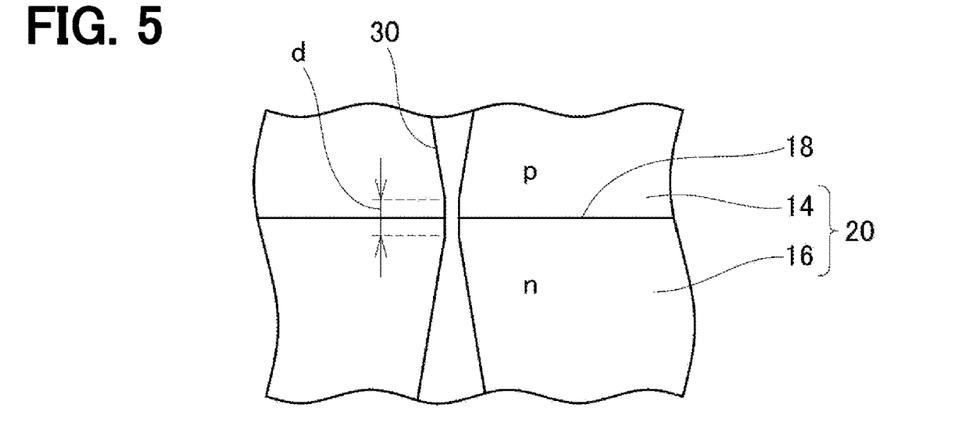
FIG. 5 is an enlarged view showing a vicinity of an interface in the manufacturing process of the semiconductor device according to the first embodiment.

Next, as shown in FIG. 4, laser light 30 is applied so as to converge on the interface 18 between the first semiconductor layer 14 and the second semiconductor layer 16. Here, scanning with the laser light 30 is performed along the interface 18 as indicated by an arrow 32 while the laser light 30 converges on the interface 18. The wavelength of the laser light 30 is approximately 400 nanometers (nm). Further, a focal point depth d of the laser light 30 used here is extremely smaller than a thickness of the semiconductor substrate 20, as shown in FIG. 5. Here, the laser light 30 is applied so that the interface 18 between the first semiconductor layer 14 and the second semiconductor layer 16 is within the focal point depth d. As the result, the laser light 30 is absorbed in the vicinity of the interface 18, and high energy can be applied to the vicinity of the interface 18. Thereby, crystal defects are formed along the interface 18.

Normally, when light enters a semiconductor, the light is not absorbed by the semiconductor when the light energy is lower than the bandgap of the semiconductor. Since the gallium nitride has a bandgap of about 3.4 eV (corresponding to a wavelength of about 365 nm), normally, the laser light 30 having a wavelength of about 400 nm is hardly absorbed. However, when an electric field is applied to the semiconductor, a wave function of carriers existing in a conduction band and a valence band transitions, and an effective bandgap of the semiconductor becomes smaller. Therefore, the so-called Franz-Keldysh effect occurs, in which an absorption edge of light (that is, the minimum energy absorbed by the semiconductor) shifts toward the longer wavelength.

Figure 6:
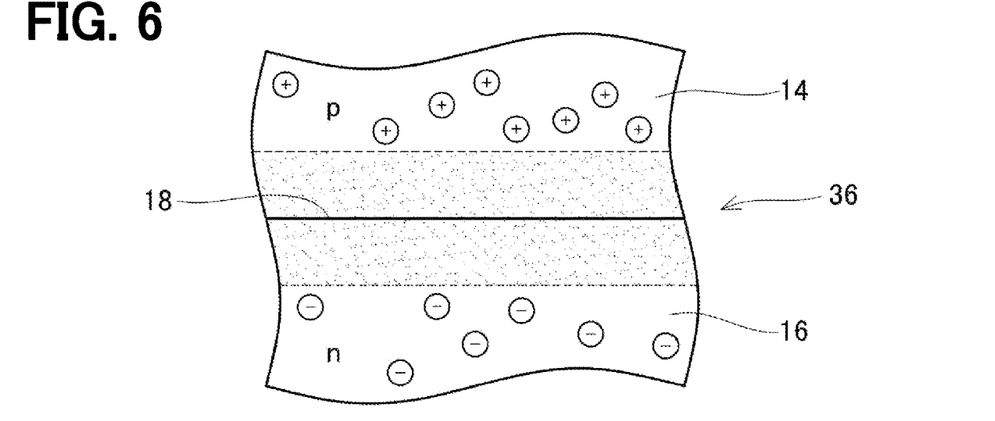
FIG. 6 is a diagram for explaining a depletion layer formed in the vicinity of the interface between the first semiconductor layer and the second semiconductor layer.

In the present embodiment, the first semiconductor layer 14 is the p-type and the second semiconductor layer 16 is the n-type. That is, a pn junction is formed between the first semiconductor layer 14 and the second semiconductor layer 16. Accordingly, as shown in FIG. 6, in the vicinity of the interface 18 between the first semiconductor layer 14 and the second semiconductor layer 16, a depletion layer 36 (that is an area indicated by dotted hatching) is formed due to the built-in potential. That is, the electric field is applied in the vicinity of the interface 18, and the absorption edge of light shifts toward the long wavelength in the vicinity of the interface 18 due to the Franz-Keldysh effect.

Figure 7:
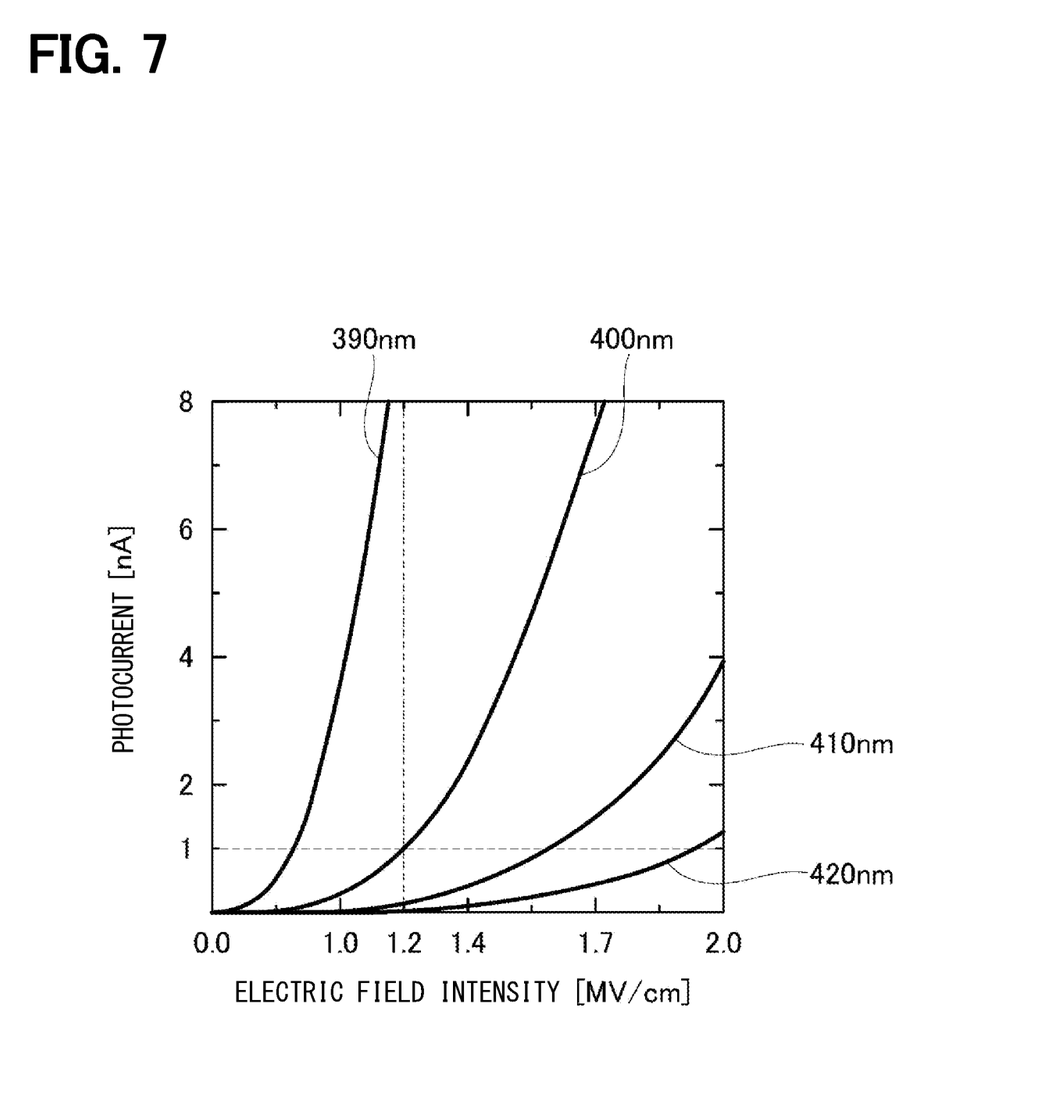
FIG. 7 is a graph showing a relationship between a wavelength of light applied to gallium nitride, a photocurrent flowing through gallium nitride, and the electric field intensity applied to gallium nitride.

FIG. 7 shows photocurrents flowing when light of various wavelengths is applied to gallium nitride having a bandgap of about 3.4 eV (corresponding to a wavelength of about 365 nm). A large photocurrent means that light is efficiently absorbed by gallium nitride. A horizontal axis of FIG. 7 indicates the electric field intensity applied to the gallium nitride. As shown in FIG. 7, the electric field intensity of 1.2 MV/cm or more is necessary in order to obtain a photocurrent of 1 nA or more when gallium nitride is irradiated with light of 400 nm. That is, in order to shift the wavelength of light absorbed by gallium nitride from 365 nm to 400 nm, it is necessary to apply an electric field with an electric field intensity of 1.2 MV/cm or more to gallium nitride. When the wavelength of light absorbed by gallium nitride is shifted from 365 nm to 400 nm, the effective bandgap of gallium nitride decreases by about 10%. The graph of FIG. 3 shows the result of simulating the relationship between the effective acceptor concentration of the first semiconductor layer 14 and the effective donor concentration of the second semiconductor layer 16 when the electric field intensity applied to the interface 18 is 1.2 MV/cm or more. As described above, in the present embodiment, the effective acceptor concentration of the first semiconductor layer 14, the effective donor concentration of the second semiconductor layer 16, and the like are adjusted so as to satisfy the relationship of the above expression representing a region 50 of FIG. 3. That is, in the vicinity of the interface 18 of the semiconductor substrate 20, the light absorption edge transitions, and the effective bandgap of gallium nitride is reduced by about 10% or more. Therefore, in the present embodiment, the laser light 30 having the wavelength of approximately 400 nm can be efficiently absorbed in the vicinity of the interface 18. Note that the laser light 30 is hardly absorbed in a region of the semiconductor substrate 20 to which no electric field is applied (that is, a region outside the depletion layer 36). Therefore, in the present embodiment, light is efficiently absorbed in the vicinity of the interface 18, and little light is absorbed at a position away from the interface 18. Accordingly, it may be possible to intensively form crystal defects in the vicinity of the interface 18.

Figure 8:
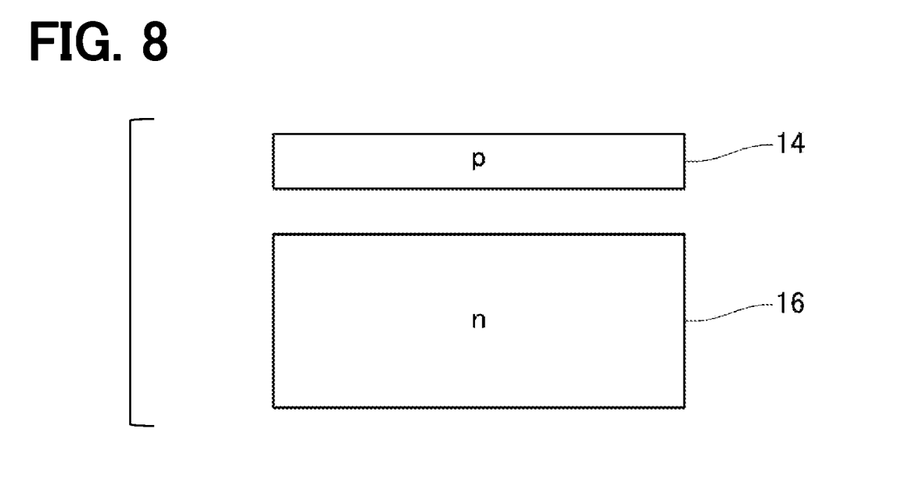
FIG. 8 shows a manufacturing process of the semiconductor device according to the first embodiment.

Next, as shown in FIG. 8, the first semiconductor layer 14 is separated from the second semiconductor layer 16. For example, a support (e.g., tape, etc.) is attached to each of a surface of the first semiconductor layer 14 and a surface of the second semiconductor layer 16, and both supports are pulled away from each other. Thereby, the first semiconductor layer 14 is separated from the second semiconductor layer 16. Since the crystal defects are formed along the interface 18 in the laser irradiation process, the first semiconductor layer 14 can be separated from the second semiconductor layer 16 along the interface 18. Thereafter, a thin semiconductor device can be manufactured using the separated first semiconductor layer 14 or second semiconductor layer 16.

As described above, in this manufacturing method, in a laser irradiation process, it may be possible to form the crystal defects intensively at the interface 18 between the first semiconductor layer 14 and the second semiconductor layer 16, and the crystal defects are hardly formed at positions other than the interface 18. In particular, since the laser light 30 with which the semiconductor substrate 20 is irradiated has relatively low energy, it may be possible to reduce the influence of the laser light 30 on semiconductor regions other than the interface 18. Accordingly, few crystal defects exist on the surfaces of the first semiconductor layer 14 and the second semiconductor layer 16 exposed after separation. That is, it may be possible to obtain a high-quality separation surface with few crystal defects. Accordingly, it may be possible to manufacture a high quality semiconductor device by using the separated first semiconductor layer 14 or the separated second semiconductor layer 16.

Second Embodiment

Figure 9:
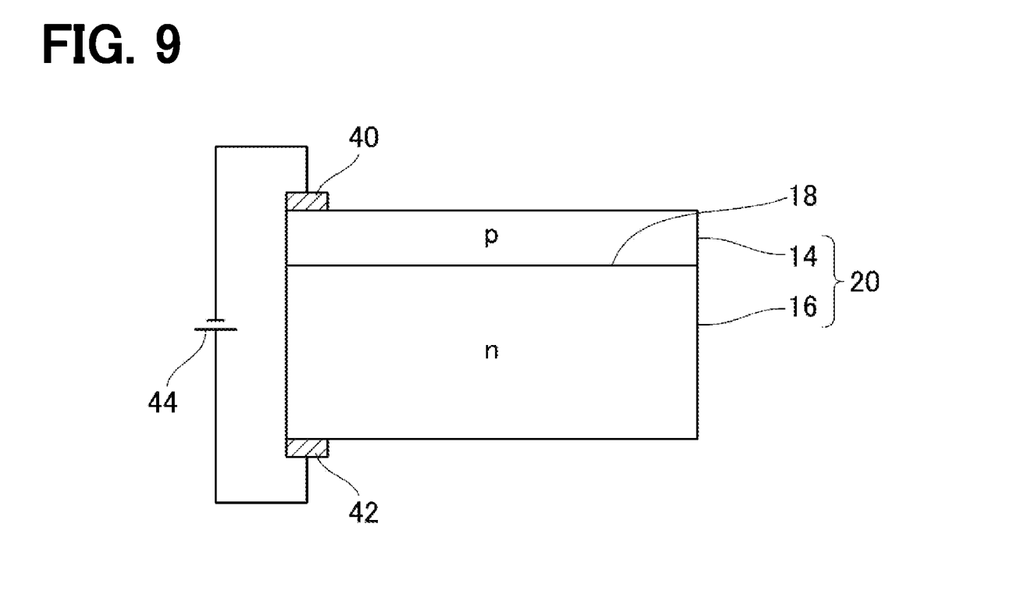
FIG. 9 shows a manufacturing process of the semiconductor device according to the second embodiment.

Next, a manufacturing method according to a second embodiment will be described. In the second embodiment, after the semiconductor substrate 20 shown in FIG. 2 of the first embodiment is manufactured, a power supply 44 is connected to the semiconductor substrate 20 as shown in FIG. 9. Specifically, an ohmic electrode 40 is formed on the surface of the first semiconductor layer 14, and an ohmic electrode 42 is formed on the surface of the second semiconductor layer 16. The power supply 44 is connected to each of the ohmic electrodes 40 and 42 in such a direction that a potential of the second semiconductor layer 16 is higher than that of the first semiconductor layer 14. That is, the power supply 44 is connected in such a direction that a reverse voltage is applied to the pn junction of the interface 18.

Next, while the reverse voltage is applied to the pn junction of the interface 18, the laser light 30 is applied so as to converge on the interface 18 and the scanning is performed with the laser light 30 along the interface 18 in the same manner as in FIG. 4. Thereby, the crystal defects are formed along the interface 18. Then, the semiconductor substrate 20 can be separated into the first semiconductor layer 14 and the second semiconductor layer 16 in the same manner as in FIG. 8 of the first embodiment.

In the second embodiment, the laser light 30 is applied while the reverse voltage is applied to the pn junction of the interface 18 between the first semiconductor layer 14 and the second semiconductor layer 16. By applying the reverse voltage to the pn junction, the depletion layer extending from the interface 18 toward each of the semiconductor layers 14 and 16 becomes larger. Therefore, the electric field intensity of the electric field applied to the vicinity of the interface 18 increases. That is, the Franz-Keldysh effect becomes greater, and the absorption edge of light shifts toward the longer wavelength. Therefore, in the second embodiment, it may be possible to absorb the laser light 30 having the longer wavelength (that is, lower energy) in the vicinity of the interface 18.

In addition, in each of the above-described embodiments, the semiconductor substrate 20 may not satisfy the relationship of the first expression. In the first embodiment, as described above, since the interface 18 (pn junction) has no little depletion layer due to the built-in potential, the electric field is applied in the vicinity of the interface 18. Therefore, even when the semiconductor substrate 20 does not satisfy the relationship of the first expression, the effective bandgap is small in the vicinity of the interface 18, and light with a wavelength longer than about 365 nm is likely to be absorbed. Further, in the second embodiment, the reverse voltage is applied to the pn junction of the interface 18. Therefore, it may be possible to apply a large electric field to the vicinity of the interface 18 even when the relationship of the first expression is not satisfied.

Figure 10:
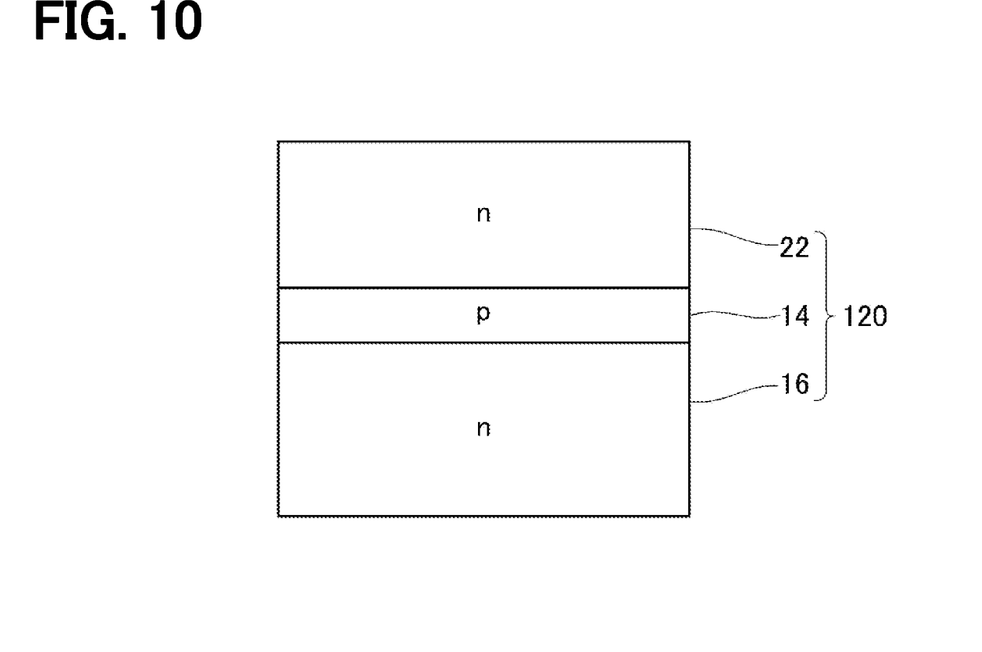
FIG. 10 shows a manufacturing process of the semiconductor device according to a modification.
Figure 11:
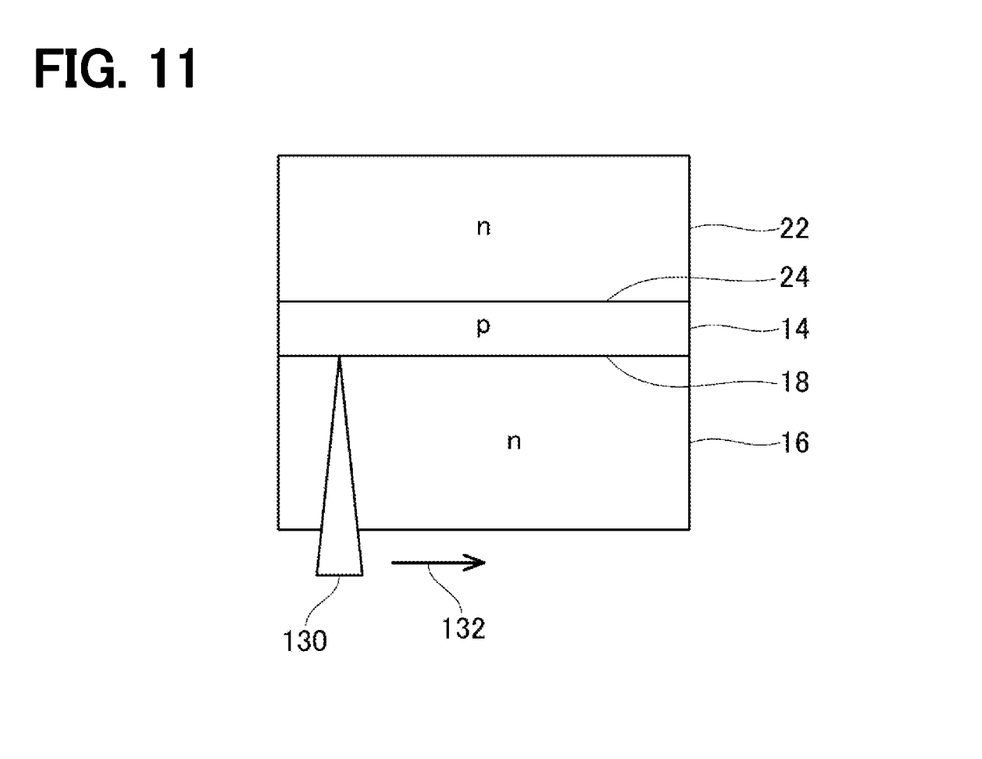
FIG. 11 shows a manufacturing process of the semiconductor device according to the modification.

Further, in each of the above-described embodiments, the example, in which the semiconductor substrate 20 has the two laminated layers of the first semiconductor layer 14 and the second semiconductor layer 16 and the layers are separated, has been described. However, even in a case of a semiconductor substrate having three or more laminated layers, the technology in this specification can also be applied. For example, in the state shown in FIG. 2 of the first embodiment, an n-type third semiconductor layer 22 may be formed on the semiconductor layer 14 as shown in FIG. 10. The third semiconductor layer 22 can be formed, for example, by epitaxially growing n-type gallium nitride. As shown in FIG. 11, the semiconductor substrate 120 obtained in such a manner is irradiated with a laser light 130 so that the laser light 30 converges on the interface 18 between the first semiconductor layer 14 and the second semiconductor layer 16, and the scanning may be performed with the laser light 30 along the interface 18 as indicated by an arrow 132. Here, the laser light 130 is applied from a position close to the second semiconductor layer 16. Thereby, the laser light 130 is efficiently absorbed in the vicinity of the interface 18, it may be possible to form the crystal defects intensively in the vicinity of the interface 18. Note that the Franz-Keldysh effect can also occur at an interface 24 between the first semiconductor layer 14 and the third semiconductor layer 22. However, since most of the laser light 130 is absorbed in the vicinity of the interface 18 (that is, most of the energy of the laser light 130 is consumed in the vicinity of the interface 18), the interface 24 is hardly affected.

Although the embodiments have been described in detail above, these are merely examples and do not limit the scope of claims. The technologies described in the claims include various modifications and modifications of the specific examples illustrated above. The technical elements described in the present specification or the drawings exhibit technical usefulness alone or in various combinations, and are not limited to the combinations described in the claims at the time of filing. In addition, the technologies illustrated in the present specification or drawings achieve a plurality of objectives at the same time, and achieving one of the objectives itself has technical usefulness.

The invention claimed is:

1. A method for manufacturing a semiconductor device, comprising
    irradiating, with laser light, a semiconductor substrate having a p-type first semiconductor layer and an n-type second semiconductor layer so that the laser light converges on an interface between the first semiconductor layer and the second semiconductor layer, wherein each of the p-type first semiconductor layer and the n-type second semiconductor layer placed on the first semiconductor layer is formed of a compound semiconductor; and
    separating the semiconductor substrate into the first semiconductor layer and the second semiconductor layer along the interface.

2. The method according to claim 1, wherein
    the compound semiconductor is gallium nitride,
    an effective acceptor concentration of the first semiconductor layer is defined as Na (cm$^{-3}$),
    an effective donor concentration of the second semiconductor layer is defined as Nd (cm$^{-3}$),
    an intrinsic carrier concentration of gallium nitride is defined as n$_i$ (cm$^{-3}$),
    a dielectric constant of gallium nitride is defined as $\varepsilon_{GaN}$ (F/cm$^2$),
    a temperature is defined as T (K), and
    a Boltzmann constant is defined as k$_B$ (J/K), wherein $$1.2 \leq \sqrt{\frac{2k_B T N_a N_d}{\varepsilon_{GaN}(N_a + N_d)} \cdot \ln\left(\frac{N_a N_d}{n_i^2}\right)}.$$

3. The method according to claim 1, wherein
    irradiating, with the laser light, the semiconductor substrate further comprises irradiating, with the laser light, the semiconductor substrate while a voltage is applied to the semiconductor substrate so that the second semiconductor layer has a higher potential than the first semiconductor layer.

* * * * *